(12) United States Patent
Chih et al.

(10) Patent No.: US 10,096,505 B2
(45) Date of Patent: Oct. 9, 2018

(54) WAFER CASSETTE

(71) Applicant: MPI Corporation, Chu-pei, Hsinchu County (TW)

(72) Inventors: Lin-Lin Chih, Chu-pei (TW);
Chien-Hung Chen, Chu-pei (TW);
Cheng-Rong Yang, Chu-pei (TW);
Stojan Kanev, Chu-pei (TW)

(73) Assignee: MPI CORPORATION, Chu-Pei, Hsinchu County (TW)

( * ) Notice: Subject to any disclaimer, the term of this patent is extended or adjusted under 35 U.S.C. 154(b) by 0 days.

(21) Appl. No.: 15/414,873

(22) Filed: Jan. 25, 2017

(65) Prior Publication Data

US 2017/0221733 A1  Aug. 3, 2017

Related U.S. Application Data

(60) Provisional application No. 62/288,698, filed on Jan. 29, 2016.

(51) Int. Cl.

| | |
|---|---|
| *G01R 31/01* | (2006.01) |
| *H01L 21/677* | (2006.01) |
| *A47B 88/497* | (2017.01) |
| *A47B 88/457* | (2017.01) |
| *G01K 13/00* | (2006.01) |
| *G01R 31/28* | (2006.01) |
| *H01L 21/673* | (2006.01) |
| *A47B 88/988* | (2017.01) |

(52) U.S. Cl.
CPC ........ *H01L 21/6773* (2013.01); *A47B 88/457* (2017.01); *A47B 88/497* (2017.01); *G01K 13/00* (2013.01); *G01R 31/2891* (2013.01); *H01L 21/67346* (2013.01); *H01L 21/67386* (2013.01); *A47B 88/988* (2017.01)

(58) Field of Classification Search
CPC ............ G01R 31/2887; G01R 31/2808; G01R 29/12; G01R 1/06705
See application file for complete search history.

(56) References Cited

U.S. PATENT DOCUMENTS

| | | | |
|---|---|---|---|
| 6,366,102 B1 | 4/2002 | Ishimoto | |
| 2005/0005702 A1* | 1/2005 | Osuga | H01L 21/6835 73/760 |
| 2009/0266740 A1* | 10/2009 | Kasama | H01L 21/67346 206/710 |

FOREIGN PATENT DOCUMENTS

| | | |
|---|---|---|
| EP | 1617461 | 1/2006 |
| JP | H10321680 A | 12/1998 |

* cited by examiner

*Primary Examiner* — Tung X Nguyen
(74) *Attorney, Agent, or Firm* — McClure, Qualey & Rodack, LLP

(57) ABSTRACT

A wafer cassette includes a case, a plurality of wafer trays, and a plurality of transmission mechanisms. The wafer trays are disposed in the case. Each of the wafer trays includes a central opening, a first groove, and a second groove. The diameter of the second groove is greater than that of the first groove. A bottom surface of the second groove is higher than that of the first groove. The first and second grooves surround the central opening. Each of the transmission mechanisms is connected to the corresponding wafer tray to move the wafer tray between a pick-up position and a received position. Since the wafer tray has grooves with different diameters, the wafer tray is capable of receiving wafers with different sizes.

7 Claims, 7 Drawing Sheets

US 10,096,505 B2

WAFER CASSETTE

CROSS-REFERENCE TO RELATED APPLICATION

This non-provisional application claims priority under 35 U.S.C. § 119(e) to U.S. Provisional Patent Application No. 62/288,698, filed on Jan. 29, 2016, the entire contents of which are hereby incorporated by reference.

BACKGROUND

Technical Field

The instant disclosure relates to a wafer cassette, in particular, to a wafer cassette capable of receiving wafers with two or more sizes.

Related Art

During the production of semiconductor elements, the received and conveying of wafers between different workstations are achieved by wafer cassettes. In general, twenty-five pieces of wafer are set as a lot; that is, a conventional wafer cassette is designed to receive twenty-five pieces of wafer with a uniform size (e.g., 6 inches, 8 inches, or 12 inches). When the wafer cassette is full, the wafers are then transmitted to the next workstation by manual operation or automatic transmission apparatuses. One of the reasons why the conventional wafer cassette receive wafers with one size is, each of the production lines in the wafer factory can process wafers with a uniform size during a time duration, and the production parameters of the production lines are needed to be reset when the size of the wafers to be processed changes. For maintaining a high production rate and a high defect-free rate, wafers with different sizes are not processed at the same time. As a result, although the wafers have diameters in 6 inches, 8 inches, or 12 inches, a single wafer cassette is adapted to receive wafers with a single size.

In addition, the reason why the size of the wafer cassette should be uniform is the numerous steps for processing wafers and the high automation procedures of wafer processing. During the production of semiconductor elements, the wafers to be processed are taken out from the wafer cassette by transmission devices, and then the wafers are placed to a to-be-processed area (or a to-be-detected area). Before the transmission device picks the wafer, the wafer cassette should be scanned by an optical equipment to determine the positions of the wafers with respect to the wafer cassette. As a result, the optical equipment may have to be redesigned otherwise the optical equipment may not determine the positions of the wafers correctly if wafers with different sizes are placed in the wafer cassette.

SUMMARY

Comparing with the conventional wafer cassette configured to receive wafers with one size, the wafer cassette of the instant disclosure is adapted to receive wafers with two or more sizes.

An embodiment of the instant disclosure provides a wafer cassette. The wafer cassette comprises a case, a plurality of wafer trays, and a plurality of transmission mechanisms. The wafer trays are in the case. Each of the wafer trays comprises a first groove and a second groove surrounding the first groove. A diameter of the second groove is greater than a diameter of the first groove and a bottom surface of the second groove is higher than a bottom surface of the first groove. The transmission mechanisms are respectively connected to the wafer trays to drive the wafer tray to move between a pick-up position and a received position.

Another embodiment of the instant disclosure provides a wafer cassette. The wafer cassette comprises a case, a first wafer tray, a second wafer tray, a first transmission mechanism, and a second transmission mechanism. The first wafer tray is in the case and movable between a first pick-up position and a first received position. The first wafer tray comprises a first central opening and a first groove surrounding the first central opening. The second wafer tray is in the case and movable between a second pick-up position and a second received position. The second wafer tray comprises a second central opening and a second groove surrounding the second central opening. A diameter of the second groove is different from a diameter of the first groove. The first transmission mechanism is connected to the first wafer tray to drive the first wafer tray to move between the first pick-up position and the first received position. The second transmission mechanism is connected to the second wafer tray to drive the second wafer tray to move between the second pick-up position and the second received position.

Yet another embodiment of the instant disclosure provides a wafer cassette. The wafer cassette comprises a case, a plurality of wafer trays, and a plurality of transmission mechanisms. The case may be omitted, and the wafer trays as well as the transmission mechanisms are received in a wafer processing/detecting device. The transmission mechanisms may share a power generation source or may have respective power generation source. Each of the wafer trays comprises a first groove and a second groove surrounding the first groove. A diameter of the second groove is greater than a diameter of the first groove and a bottom surface of the second groove is higher than a bottom surface of the first groove. A transmission device takes a wafer from the wafer tray or places a wafer in the wafer tray by vacuum suctioning. In addition, display lights may be disposed on the front portion of the wafer processing/detecting device.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
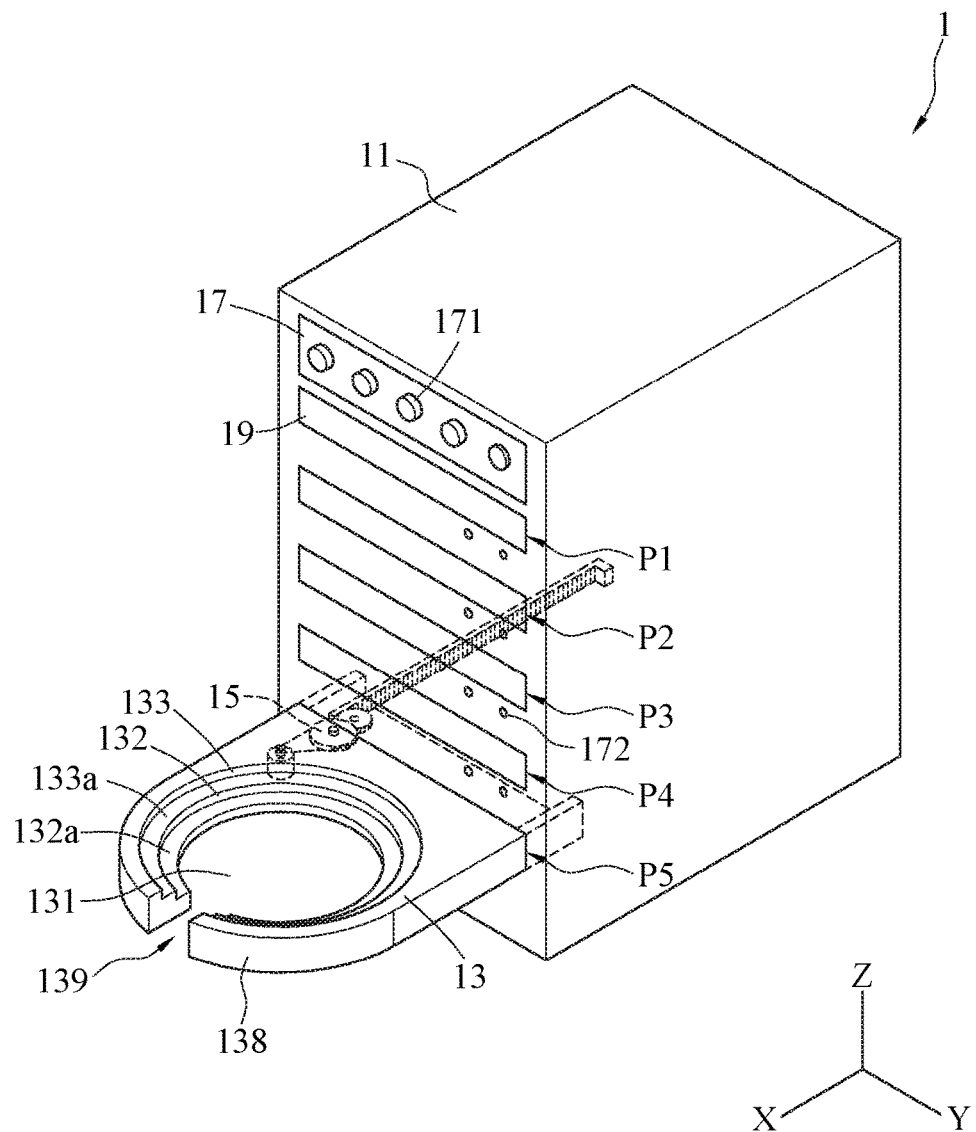
FIG. 1 illustrates a schematic view (1) of a first embodiment of a wafer cassette of the instant disclosure.

FIG. 1 illustrates a schematic view of a first embodiment of a wafer cassette of the instant disclosure. As shown, the wafer cassette 1 comprises a case 11, a plurality of wafer trays 13, and a plurality of transmission mechanisms 15. For the sake of clarity, in FIG. 1, the wafer tray 13 and the transmission mechanism 15 at P5 are illustrated, and the rest wafer trays 13 and the rest transmission mechanisms 15 at P1 to P4 are not shown. That is, in this embodiment, the wafer cassette 1 comprises five wafer trays 13 and five transmission mechanisms 15, and the wafer trays 13 are equidistantly disposed in the case 11 along a vertical direction.

Each of the wafer trays 13 comprises a central opening 131, a first groove 132, and a second groove 133. The first groove 132 surrounds the central opening 131. The second groove 133 surrounds the first groove 132. A diameter of the second groove 133 is greater than a diameter of the first groove 132, and a bottom surface 133a of the second groove 133 is higher than a bottom surface 132a of the first groove 132. In addition, each of the wafer trays 13 further comprises an outer periphery 138 and a hollowed area 139 extending from the central opening 131 to the outer periphery 138. The first groove 132 and the second groove 133 are adapted to receive wafers with different sizes, respectively. For example, the first groove 132 (which is smaller) is adapted to receive 6-inch wafers, and the second groove 133 (which is larger) is adapted to receive 8-inch wafers. In another embodiment, the first groove 132 is adapted to receive 8-inch wafers, and the second groove 133 is adapted to receive 12-inch wafers.

The transmission mechanism 15 is connected to the wafer tray 13 to move the wafer tray 13 between a first pick-up position and a first received position. As shown in FIG. 1, the wafer tray 13 is at the pick-up position, and the wafer trays at P1 to P4 are at their received positions, shielded by a cover plate 19, and not shown in FIG. 1.

In this embodiment, the wafer cassette 1 further comprises a control module 17 electrically connected to each of the transmission mechanisms 15, so that the control module 17 controls the wafer tray 13 to move between the pick-up position and the received position. When the wafer cassette 1 is assembled to a wafer processing/detecting device, the control module 17 will be electrically connected to the wafer processing/detecting device, so that the wafer processing/detecting device can drive the wafer tray 13 to move between the pick-up position and the received position by the control module 17. In addition, the control module 17 may comprise a plurality of switches 171. Hence, an operator can press the switches 171 to control the wafer tray 13 to move between the pick-up position and the received position.

In this embodiment, the wafer cassette 1 further comprises display lights 172 on the case 11, and the positions of the display lights 172 correspond to the positions of the wafer trays 13. An operator can determine if the wafer tray 13 is empty or occupied by different light signals emitted from the display lights 172, or the display lights 172 may be adapted to indicate other default states of the wafer trays 13. In addition, once the wafer cassette 1 is assembled to a wafer processing/detecting device 9, the display lights 172 may be on a front portion of the wafer processing/detecting device 9, so that the operator can recognize the light signals of the display lights 172 conveniently.

In this embodiment, the case 11 of the wafer cassette 1 may be separated into a plurality of disconnected rooms. The rooms are adapted to receive the wafer trays 13. That is, when each of the wafer trays 13 is at the corresponding received position, the wafer tray 13 is not in communication with ambient atmosphere. Accordingly, the rooms can be purged with inert gases or vacuumed, so that the wafers not processed can be received in the rooms and stayed in certain gaseous environments.

Figure 2:
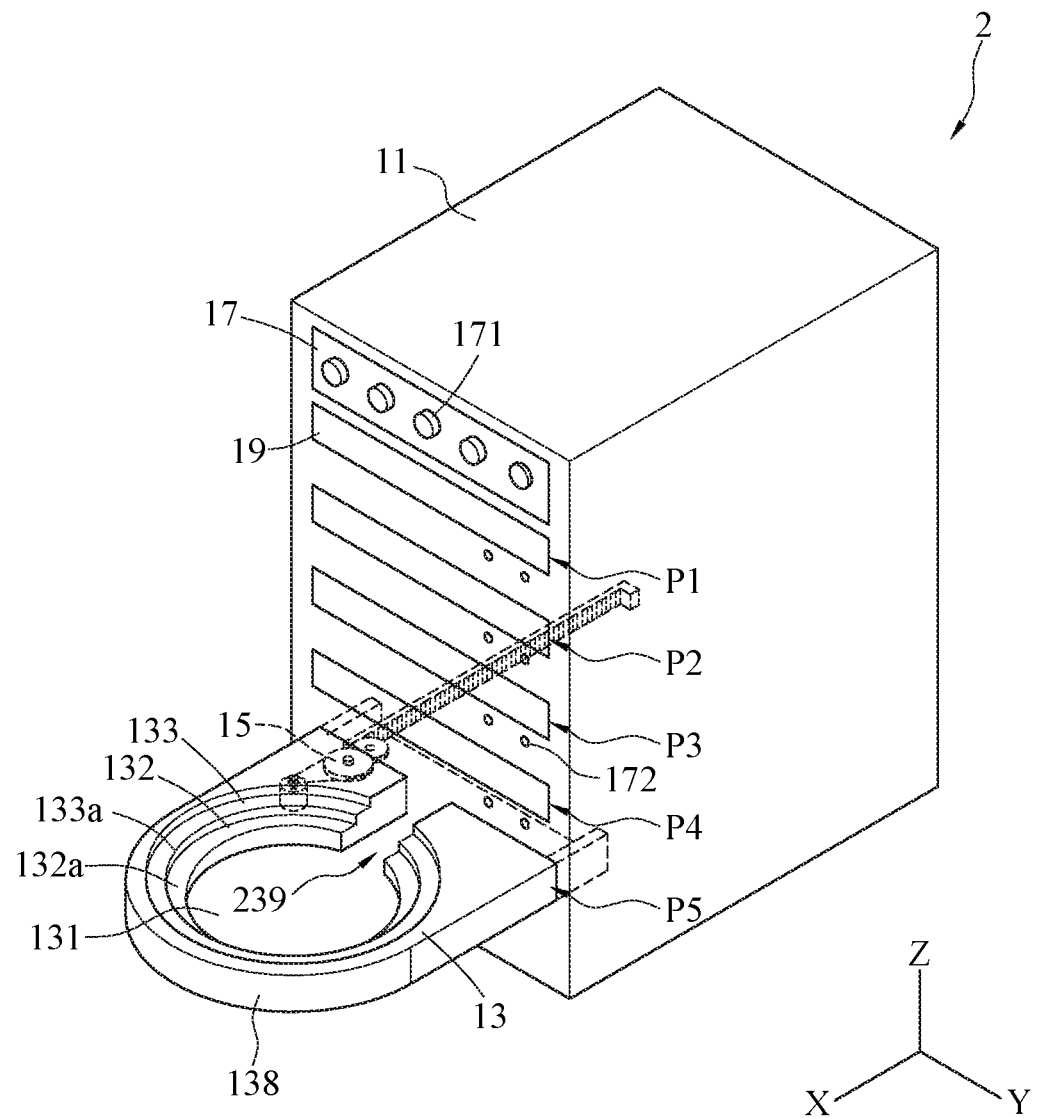
FIG. 2 illustrates a schematic view (2) of the first embodiment of the wafer cassette.
Figure 3:
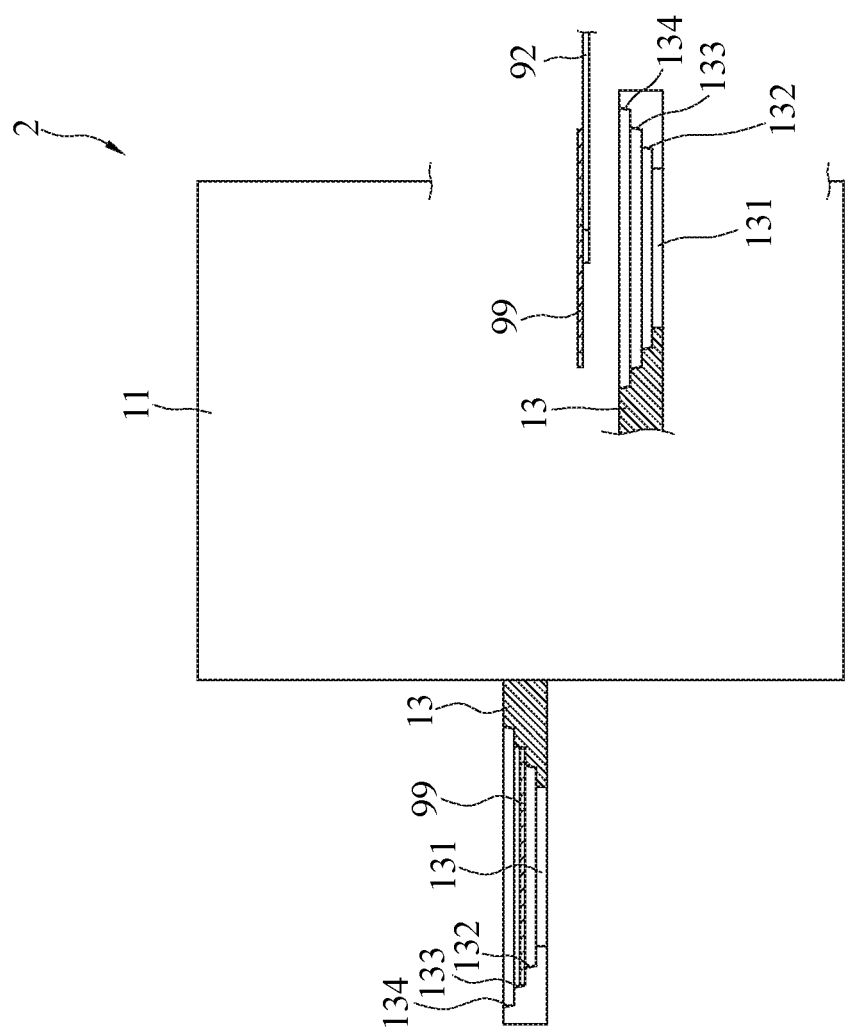
FIG. 3 illustrates a schematic view (3) of the first embodiment of the wafer cassette.

Please refer to FIGS. 2 and 3, showing a variation of the first embodiment. In this embodiment, the position of the hollowed area 139 is different from that shown in FIG. 1. In FIG. 1, the opening of the hollowed area 139 faces the +X axis direction; while in FIG. 2, the opening of the hollowed area 239 faces the −X axis direction. When the wafer tray 13 is at the pick-up position (as the left portion in FIG. 3), an operator can use his/her hand(s) to place a wafer 99 in the wafer tray 13, and then, the wafer tray 13 moves along a right direction (i.e., the −X axis direction in FIG. 2) and back to the received position. When a transmission device 92 tends to take the wafer 99, the back surface of the case 11 (the surface taking the −X axis as the normal direction) may comprise an opening or may be hollowed to allow the transmission device 92 to take the wafer 99 from the wafer tray 13 along the −X axis direction (as the right portion in FIG. 3). Because the water tray 13 comprises the hollowed area 239, the transmission device 92 can reach to a position beneath the wafer 99 to lift up the wafer 99.

Figure 4:
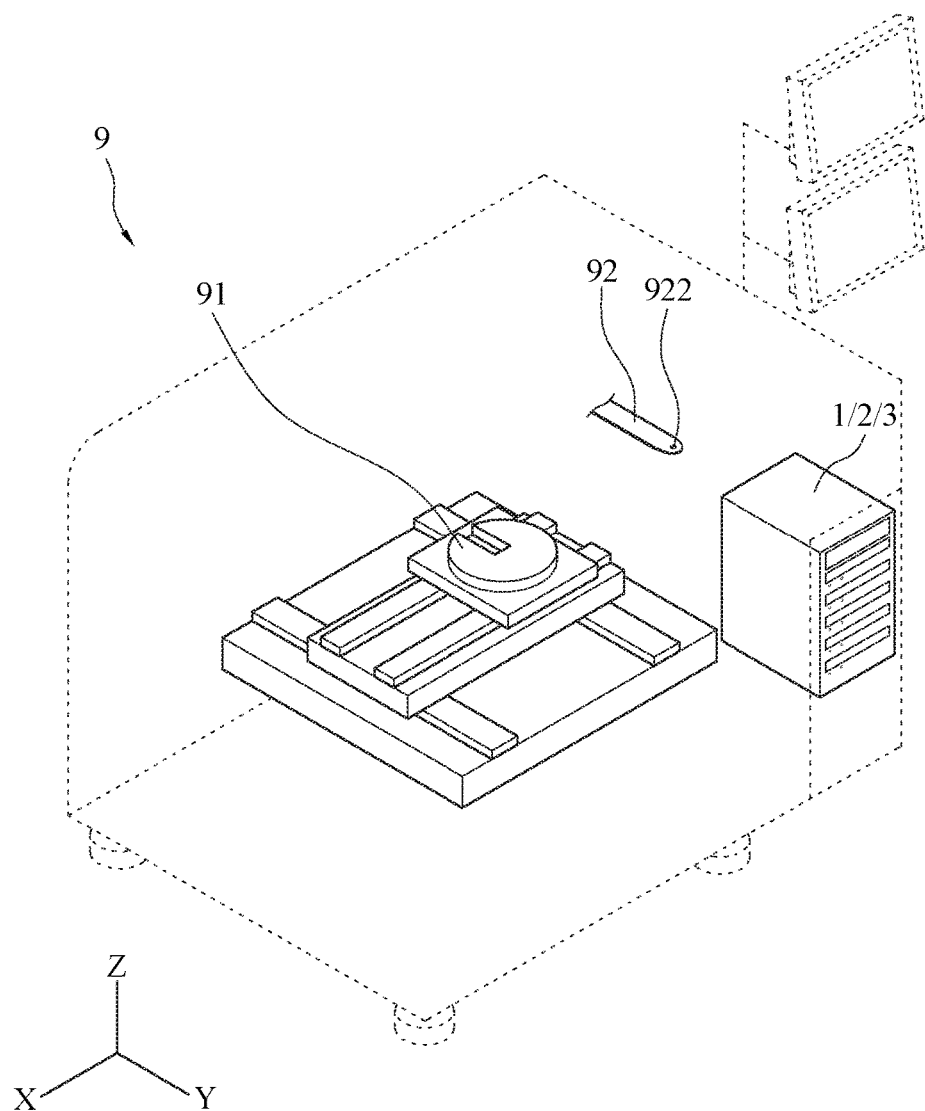
FIG. 4 illustrates a schematic view of a wafer processing/detecting device.

Please refer to FIG. 4, illustrating a wafer processing/detecting device 9. FIG. 4 roughly illustrates a wafer cassette 2 assembled to the wafer processing/detecting device 9; the dimensions and scales of the wafer cassette 2 and the wafer processing/detecting device 9 are for illustrative purposes, rather than indicating the actual scale relationship of the wafer cassette 2 and the wafer processing/detecting device 9.

The wafer processing/detecting device 9 has a wafer stage 91 and a transmission device 92. A vacuum slot 922 is disposed on an end portion of the transmission device 92. As shown, in operation, the wafer may be placed in the wafer cassette 2 manually, and the wafer processing/detecting device 9 can, by the transmission device 92, take the wafer in the wafer cassette 2 from the back of the wafer cassette 2 (the surface taking the −X axis as the normal direction in FIG. 2), and then place the wafer on the wafer stage 91 for further processing or detection procedures.

Figure 5:
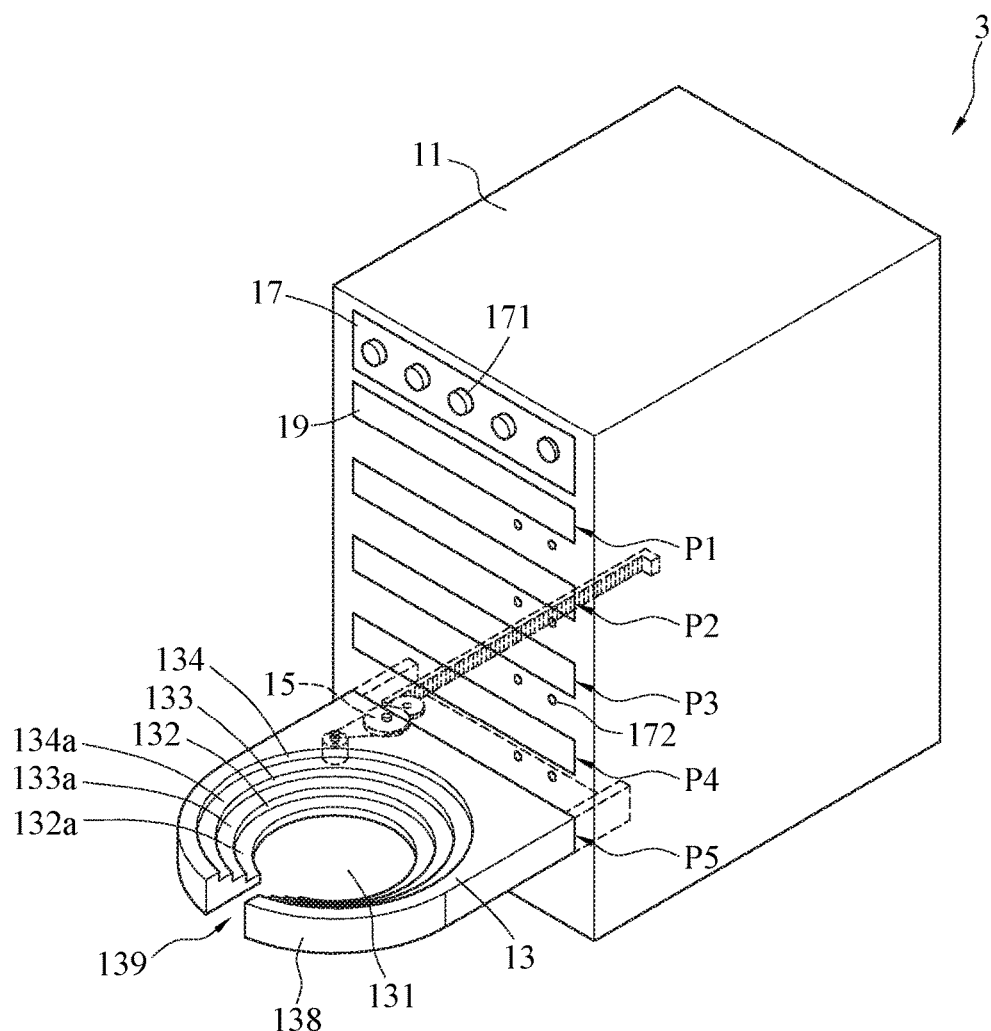
FIG. 5 illustrates a schematic view of a second embodiment of a wafer cassette of the instant disclosure.

Please refer to FIG. 5, illustrating a second embodiment of a wafer cassette 3 of the instant disclosure. In this embodiment, the wafer cassette 3 further comprises a third groove 134. The third groove 134 surrounds the second groove 133. A diameter of the third groove 134 is greater than the diameter of the second groove 133, and a bottom surface 134a of the third groove 134 is higher than the bottom surface 133a of the second groove 133. In one embodiment, the wafer trap 13 comprises the third groove 134, and the position of the opening of the hollowed area 139 is alike that shown in FIG. 2.

Figure 6:
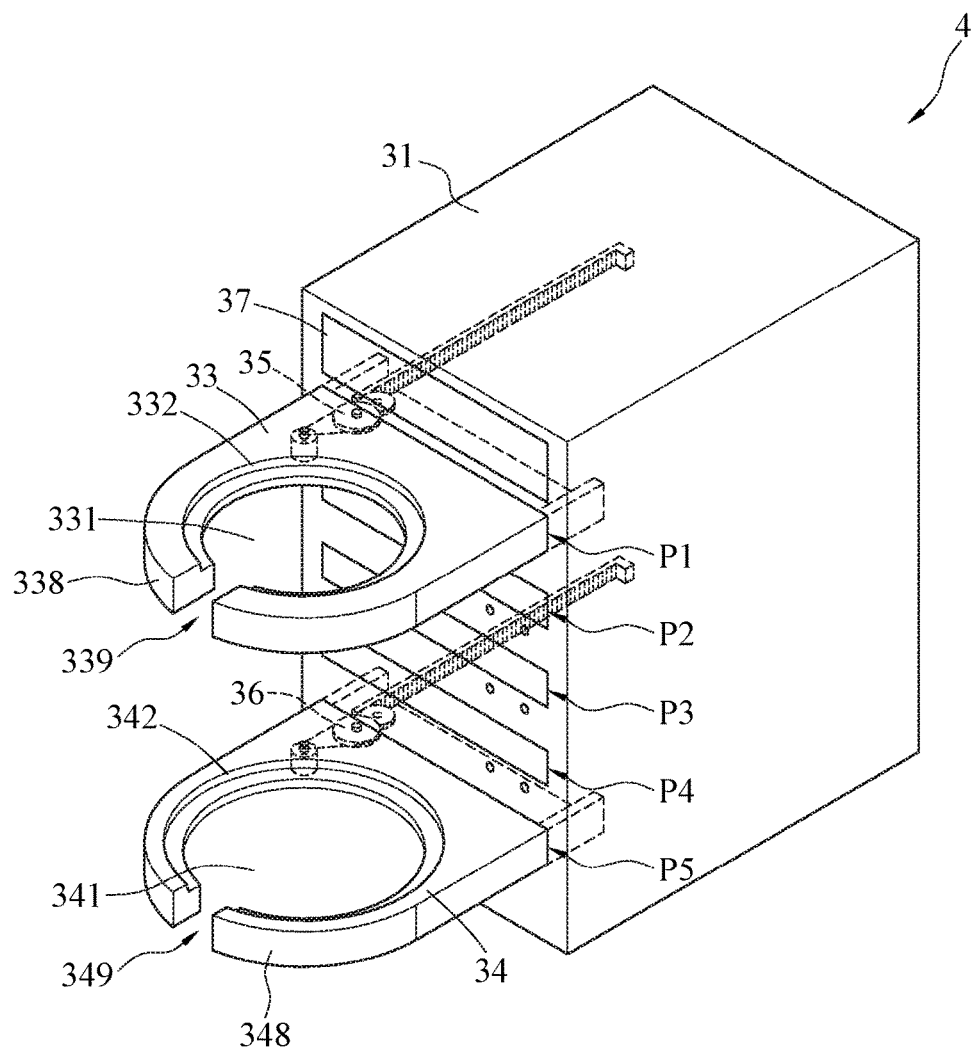
FIG. 6 illustrates a schematic view of a third embodiment of a wafer cassette of the instant disclosure.

Please refer to FIG. 6, illustrating a third embodiment of a wafer cassette 4 of the instant disclosure. In this embodiment, the wafer cassette 4 comprises a case 31, a first wafer tray 33, a second wafer tray 34, a first transmission mechanism 35, and a second transmission mechanism 36. The first wafer tray 33 is disposed in the case 31 and is movable between a first pick-up position and a first received position, and the second wafer tray 34 is also disposed in the case 31 and is movable between a second pick-up position and a second received position. As shown in FIG. 6, the first wafer tray 33 and the second wafer tray 34 are respectively at the first pick-up position and the second pick-up position, while the wafer trays at P2 to P4 are at the received positions, shielded by the cover plate 39, and not shown for the sake of clarity.

The first wafer tray 33 comprises a first central opening 331 and a first groove 332 surrounding the first central opening 331. The second wafer tray 34 comprises a second central opening 341 and a second groove 342 surrounding the second central opening 341. A diameter of the second groove 342 is different from a diameter of the first groove 332. Therefore, the first wafer tray 33 and the second wafer tray 34 are adapted to receive wafers with different sizes.

As shown in FIG. 6, the first wafer tray 33 further comprises a first outer periphery 338 and a first hollowed area 339 extending from the first central opening 331 to the first outer periphery 338. Similarly, the second wafer tray 34 further comprises a second outer periphery 348 and a second hollowed area 349 extending from the second central opening 341 to the second outer periphery 348. In one embodiment, the position of the opening of the first hollowed area 339 (and that of the second hollowed area 349) is alike the position of the opening of the hollowed area shown in FIG. 2.

The first transmission mechanism 35 is connected to the first wafer tray 33 to drive the first wafer tray 33 to move between the first pick-up position and the first received position. The second transmission mechanism 36 is connected to the second wafer tray 34 to drive the second wafer tray 34 to move between the second pick-up position and the second received position.

In this embodiment, the wafer cassette 4 further comprises a control module 37 electrically connected to the first transmission mechanism 35 and the second transmission mechanism 36, for controlling the first wafer tray 33 to move between the first pick-up position and the first received position and controlling the second wafer tray 34 to move between the second pick-up position and the second received position. In addition, the control module 37 is also electrically connected to the transmission mechanisms at P2 to P4 (not shown). When the wafer cassette 4 is assembled to a wafer processing/detecting device, the control module 37 will be electrically connected to the wafer processing/detecting device, so that the wafer processing/detecting device can, by the control module 37, drive the first wafer tray 33 to move between the first pick-up position and the first received position or drive the second wafer tray 34 to move between the second pick-up position and the second received position.

Figure 7:
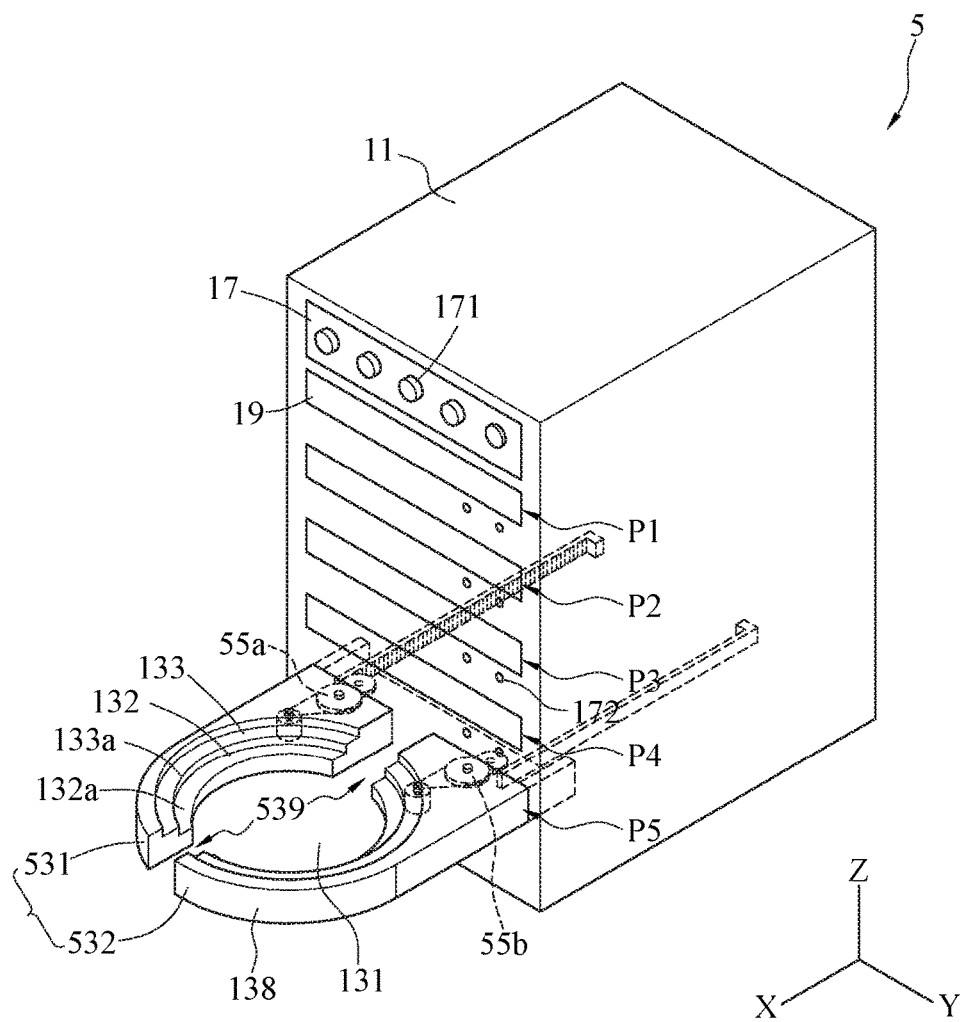
FIG. 7 illustrates a schematic view of a fourth embodiment of a wafer cassette of the instant disclosure.

Please refer to FIG. 7, illustrating a schematic view of a fourth embodiment of a wafer cassette 5 of the instant disclosure. In this embodiment, the wafer tray 53 comprises two opposite hollowed areas 539; that is, the wafer tray 53 comprises a hollowed area 539 having an opening corresponding to the +X axis direction and a hollowed area 539 having an opening corresponding to the −X axis direction. Hence, the wafer tray 53 is divided into a first portion 531 and a second portion 532. The first portion 531 and the second portion 532 of the wafer tray 53 are individually driven by the transmission mechanisms 55a, 55b, so that the first portion 531 and the second portion 532 can be moved out of the case 11 or moved into the case 11.

Please also refer to FIG. 3. When the wafer tray 53 is moved out of the case 11, because the wafer tray 53 comprises the hollowed area 539 with its opening facing the +X axis direction, the transmission device 92 shown in FIG. 3 can be applied to take the wafer 99 from the wafer tray 53 or to place the wafer 99 in the empty wafer tray 53. It is understood that an operator can also use his/her hand(s) or use a vacuum pen to take the wafer 99 from the wafer tray 53 or to place the wafer 99 in the empty wafer tray 53. In the case that the operator uses his/her hand(s) to place the wafer 99 in the empty wafer tray 53, for improving the accuracy in wafer alignments, the wafer tray 53 may have labels like alignment lines, arrows, etc., so that the operator can place the wafer 99 in the wafer tray 53 with a proper orientation based on the instructions of the alignment labels.

When the wafer tray 53 is moved into the case 11, because the wafer tray 53 comprises the hollowed area 539 with its opening facing the −X axis direction, and because the back of the case 11 comprises an opening or the back of the case 11 is completely hollowed, the transmission device 92 can reach to a position beneath the wafer 99 along the −X axis direction, and then move along the +Z axis direction to pass through the hollowed area 539 with its opening facing the −X axis direction to lift up the wafer 99. In addition, the transmission device 92 already carrying a wafer 99 can reach to a position above the wafer tray 53 and then move along the −Z axis direction to pass through the hollowed area 539 with its opening facing the −X axis direction to place the wafer 99 in the empty wafer tray 53.

It is understood that, because the wafer tray 53 is adapted to receive the wafer 99, the transmission mechanism 55a and the transmission mechanism 55b should respectively drive the first portion 531 and the second portion 532 in a synchronized manner. Consequently, the synchronized movements of the first portion 531 and the second portion 532 can prevent the wafer 99 in the wafer tray 53 from being broken.

Please refer to FIG. 6. The features in the fourth embodiment may be applied to the wafer cassette 4 of the third embodiment; that is, the first wafer tray 33 may comprise two opposite first hollowed areas 339 and the second wafer tray 34 may comprise two opposite second hollowed areas 349.

Accordingly, when the first wafer tray 33 and the second wafer tray 34 are moved out of the case 11, the transmission device 92 shown in FIG. 3 can be applied to take the wafer 99 from the first wafer tray 33 or the second wafer tray 34, or the transmission device 92 can be applied to place the wafer 99 in the empty first wafer tray 33 or the empty second wafer tray 34. It is understood that an operator can also use his/her hand(s) or use a vacuum pen to take the wafer 99 from the first wafer tray 33 or the second wafer tray 34, or to place the wafer 99 in the empty first wafer tray 33 or the empty second wafer tray 34. Conversely, when the first wafer tray 33 and the second wafer tray 34 are moved into the case 11, the transmission device 92 can reach to a position below the wafer 99 in the first wafer tray 33 or the second wafer tray 34 to lift up the wafer 99, or the transmission device 92 already carrying a wafer 99 can reach to a position above the first wafer tray 33 or the second wafer tray 34 to place the wafer 99 in the empty first wafer tray 33 or the empty second wafer tray 34.

It is understood that, the positions of the two hollowed areas 539 may be respectively aligned along the +X axis direction and the −X axis direction of the same X axis as shown in FIG. 7, but embodiments are not limited thereto. The positions of the two hollowed areas may be respectively aligned along the X axis direction and the Y axis direction to form an orthogonal configuration. In another embodiment, the positions of the two hollowed areas are neither respectively aligned along the +X axis direction and the −X axis direction of the same X axis nor respectively aligned along the X axis direction and the Y axis direction to form an orthogonal configuration.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A wafer cassette, comprising:
a plurality of wafer trays, wherein each of the wafer trays comprises a first groove and a second groove surrounding the first groove, wherein a diameter of the second groove is greater than a diameter of the first groove and a bottom surface of the second groove is higher than a bottom surface of the first groove;
a plurality of transmission mechanisms respectively connected to the wafer trays to move the wafer trays between a pick-up position and a received position and
wherein each of the wafer trays further comprises an outer periphery, two hollowed areas, and a central opening, each of the hollowed areas is extending from the central opening to the outer periphery, and the two hollowed areas are opposite to each other.

2. The wafer cassette according to claim 1, further comprising a control module electrically connected to each of the transmission mechanisms.

3. A wafer cassette, comprising:
a case;
a first wafer tray in the case and movable between a first pick-up position and a first received position, wherein the first wafer tray comprises a first central opening and a first groove surrounding the first central opening;
a second wafer tray in the case and movable between a second pick-up position and a second received position, wherein the second wafer tray comprises a second central opening and a second groove surrounding the second central opening, wherein a diameter of the second groove is different from a diameter of the first groove;
a first transmission mechanism connected to the first wafer tray to drive the first wafer tray to move between the first pick-up position and the first received position; and
a second transmission mechanism connected to the second wafer tray to drive the second wafer tray to move between the second pick-up position and the second received position.

4. The wafer cassette according to claim 3, wherein the first wafer tray further comprises a first outer periphery and a first hollowed area extending from the first central opening to the first outer periphery.

5. The wafer cassette according to claim 4, wherein the second wafer tray further comprises a second outer periphery and a second hollowed area extending from the second central opening to the second outer periphery.

6. The wafer cassette according to claim 3, wherein the first wafer tray further comprises a first outer periphery and two first hollowed areas, each of the first hollowed areas is extending from the first central opening to the first outer periphery, and the two first hollowed areas are opposite to each other, the second wafer tray further comprises a second outer periphery and two second hollowed areas, each of the second hollowed areas is extending from the second central opening to the second outer periphery, and the two second hollowed areas are opposite to each other.

7. The wafer cassette according to claim 6, further comprising a control module electrically connected to the first transmission mechanism and the second transmission mechanism.

* * * * *